US012363873B2

(12) United States Patent
Casci et al.

(10) Patent No.: US 12,363,873 B2
(45) Date of Patent: Jul. 15, 2025

(54) ELECTRIFIED VEHICLE INDUCTOR COOLING SYSTEM

(71) Applicant: FORD GLOBAL TECHNOLOGIES, LLC, Dearborn, MI (US)

(72) Inventors: John Casci, Westland, MI (US); Baoming Ge, Okemos, MI (US); Fan Wang, Novi, MI (US); Moon Young Lee, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 443 days.

(21) Appl. No.: 17/900,511

(22) Filed: Aug. 31, 2022

(65) Prior Publication Data

US 2024/0074121 A1 Feb. 29, 2024

(51) Int. Cl.
*H05K 7/20* (2006.01)

(52) U.S. Cl.
CPC ............................... *H05K 7/20872* (2013.01)

(58) Field of Classification Search
CPC .......... H05K 7/20845; H05K 7/20872; H05K 7/2089; H05K 7/20927; H05K 7/20272; F16H 57/0423; F16H 57/0457; H01F 27/2876
See application file for complete search history.

(56) References Cited

U.S. PATENT DOCUMENTS

| 8,159,823 | B2 | 4/2012 | Murakami et al. |
| 9,127,762 | B2 | 9/2015 | Oh et al. |
| 9,441,725 | B2 * | 9/2016 | Dobbins ............... B60W 20/00 |
| 9,538,691 | B2 | 1/2017 | Kikuchi et al. |
| 9,581,234 | B2 | 2/2017 | Sung et al. |
| 9,999,150 | B2 | 6/2018 | Maeda et al. |
| 10,204,729 | B2 | 2/2019 | Yonak et al. |
| 10,529,479 | B2 | 1/2020 | Skalski et al. |
| 11,195,649 | B2 | 12/2021 | Vafakhah et al. |
| 2009/0025918 | A1 * | 1/2009 | Kumar .................... F28D 9/005 165/159 |
| 2014/0132378 | A1 * | 5/2014 | Vafakhah ............... H01F 27/325 903/902 |
| 2014/0132379 | A1 | 5/2014 | Vafakhah et al. |
| 2018/0130592 | A1 | 5/2018 | Yonak et al. |
| 2021/0151245 | A1 * | 5/2021 | Casci ................. H05K 7/20927 |
| 2022/0157507 | A1 | 5/2022 | Lee |

* cited by examiner

*Primary Examiner* — Timothy J. Dole
*Assistant Examiner* — Matthew Sinclair Muir
(74) *Attorney, Agent, or Firm* — Brooks Kushman PC; David B. Kelley

(57) ABSTRACT

An electrified vehicle includes an inductor having an associated arcuate deflector to redirect fluid toward inductor coils to facilitate heat transfer. The inductor may be disposed within a transmission proximate to at least one gear that distributes fluid during rotation to proximate components to provide splash lubrication. The arcuate deflector may redirect splashed fluid from between the inductor and the transmission housing toward the inductor coils. The deflector may be secured to the inductor via terminal connectors that electrically couple the inductor coils to a bus bar connected to a variable voltage converter.

15 Claims, 4 Drawing Sheets

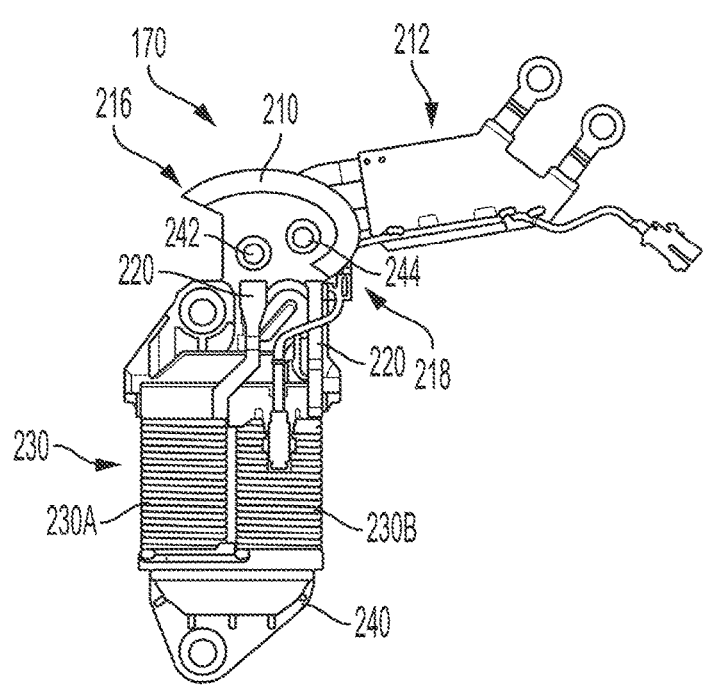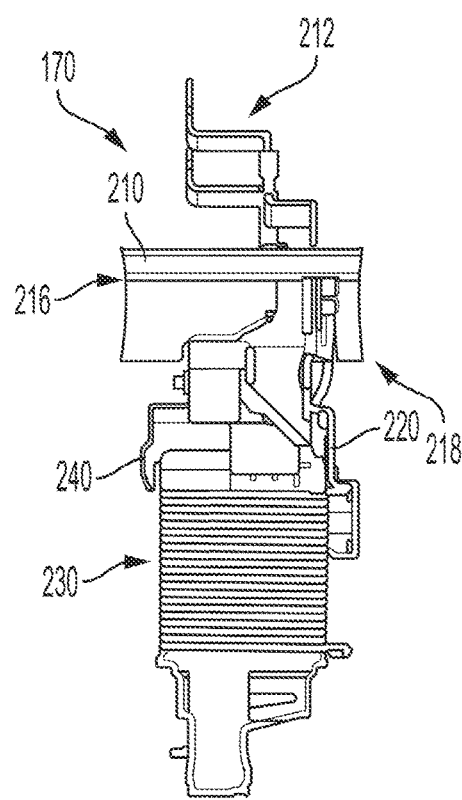
FIG. 2A
FIG. 2B

ELECTRIFIED VEHICLE INDUCTOR
COOLING SYSTEM

TECHNICAL FIELD

This disclosure relates to a system for liquid cooling of an inductor in an electrified vehicle.

BACKGROUND

Electrified vehicles include a battery that powers an electric machine to propel the vehicle. A voltage converter may be used to increase/decrease battery voltage for the electric machine and/or various electrically powered vehicle components. Electrified vehicles that have AC electric machines also include an inverter to convert DC voltage from the battery to AC voltage/current provided to the electric machine(s). The voltage converter may include an inductor (or reactor) assembly to reduce current fluctuations, as well as various switches, diodes, and other circuitry that generate heat during operation. The inductor may be disposed within the vehicle transmission housing and cooled by transmission fluid distributed by rotation of gears or other components of the transmission.

SUMMARY

An electrified vehicle having an electric machine powered by a battery to propel the electrified vehicle includes a transmission having at least one gear disposed within a housing and configured to rotate within the housing and splash fluid within the housing, an inductor including a core having conductive windings wrapped around the conductive core, the inductor disposed within the housing proximate to the at least one gear, and a baffle connected to the inductor and configured to redirect fluid splashed from the at least one gear toward the core and conductive windings. The baffle may comprise an arcuate baffle configured to redirect fluid splashed between the housing and the inductor toward the core and conductive windings. The baffle may be secured to terminals connecting the conductive windings of the inductor to a bus bar of the electrified vehicle. The inductor may be electrically connected to a voltage converter connected to the battery and the electric machine. The inductor may be positioned at least partially above the at least one gear and the baffle may be positioned above the core and the conductive windings. The baffle may comprise an arcuate baffle including an inlet in contact with the housing. In various embodiments, the baffle comprises a cochlear baffle. Embodiments may also include an inductor comprising a body having first and second legs with a first section of the conductive windings wrapped around the first leg and a second section of the conductive windings wrapped around the second leg, wherein the baffle extends over the first and second legs.

One or more embodiments include an inductor having a conductor extending between a first terminal and a second terminal, the conductor including a coil portion wound around a core; and an arcuate fluid diverter configured to redirect fluid moving around the conductor toward an exterior of the coil portion. The core may include a first leg and a second leg, wherein the arcuate fluid diverter extends over/beyond the first and second legs of the core. The arcuate fluid diverter may be secured to the first and second terminals.

Embodiments may also include an electrified vehicle transmission comprising a housing, at least one gear disposed within the housing and configured to splash fluid within the housing while the at least one gear is rotating, and an inductor disposed within the housing and including a coil wound around a core, the coil positioned with at least a portion of an exterior surface exposed to the fluid splashed during rotation of the at least one gear, the inductor including an arcuate fluid diverter positioned to redirect a portion of the fluid splashed during rotation of the at least one gear toward the coil. The fluid diverter may include an inlet redirecting fluid splashed between the inductor and the housing. The inlet of the fluid diverter may contact the housing. The coil may include a first portion wound around a first leg and a second portion would around a second leg. The inductor may be electrically connected to a variable voltage converter (VVC). The diverter may be secured to bus bar terminals electrically connecting the inductor to the VVC.

One or more embodiments according to the disclosure may have associated advantages. For example, the diverter may increase heat transfer from the inductor coil by increasing the volume of fluid splashed from proximate components within the transmission that contacts the inductor coils. A diverter or baffle according to various embodiments may enhance cooling performance and robustness over a broader range of operating conditions, particularly where higher rotational speeds of transmission gearing may otherwise splash fluid away from or beyond the inverter coils.

BRIEF DESCRIPTION OF THE DRAWINGS

FIG. 2A is a front view, and FIG. 2B is a side view, of an inductor having a fluid deflector according to a representative embodiment.

DETAILED DESCRIPTION

Embodiments of the present disclosure are described herein. It is to be understood, however, that the disclosed embodiments are merely examples and other embodiments can take various and alternative forms. The figures are not necessarily to scale and may be simplified; some features could be exaggerated, minimized, or omitted to show details of particular components. Therefore, specific structural and functional details disclosed herein are not to be interpreted as limiting, but merely as a representative basis for teaching one skilled in the art to variously employ the claimed subject matter. As those of ordinary skill in the art will understand, various features illustrated and described with reference to any one of the figures can be combined with features illustrated in one or more other figures to produce embodiments that are not explicitly illustrated or described, but within the scope of the claimed subject matter. The combinations of features illustrated provide representative embodiments for typical applications. Various combinations and modifications of the features consistent with the teachings of this disclosure, however, could be desired for particular applications or implementations.

The present inventors have recognized that cooling performance of an inductor for a voltage converter of an electrified vehicle installed in the transmission housing and cooling with transmission fluid splashed by rotation of one or more gears may vary based at least in part on the rotational speed of the gear(s). Cooling performance may increase as rotational speed increases, but then peak and decrease at higher rotational speeds that may result in less fluid contacting the inductor coils. In addition, higher rotational speeds are often associated with higher current through the inductor and more generated heat presenting additional thermal management challenges.

Figure 1:
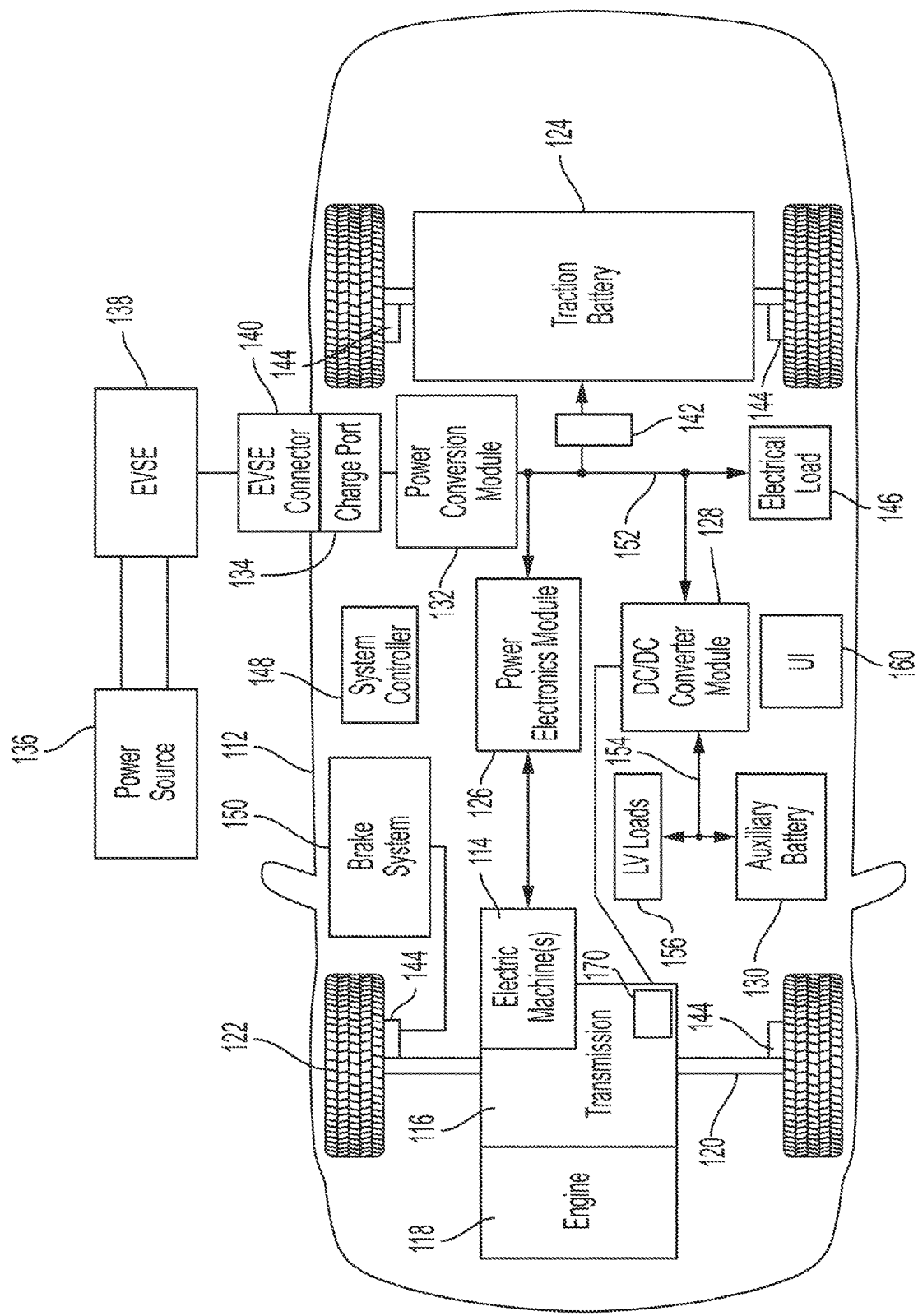
FIG. 1 illustrates a representative electrified vehicle having a transmission including a voltage converter inductor having a baffle to redirect fluid toward the inductor coils.

FIG. 1 illustrates a representative electrified vehicle 112 implemented by a plug-in hybrid-electric vehicle (PHEV) for purposes of illustration and description. Those of ordinary skill in the art will recognize that an inductor as described herein may be used in other types of electrified vehicles, such as a battery electric vehicle (BEV), which do not include an engine 118. Similarly, applications of an inductor as described herein are not limited to passenger vehicles and may include commercial and transportation vehicles as well as some other non-vehicle applications.

Electrified vehicle 112 may include one or more electric machines 114 mechanically coupled to a gearbox or hybrid transmission 116. The electric machines 114 may be capable of operating as a motor and a generator. In addition, the hybrid transmission 116 is mechanically coupled to an engine 118. The hybrid transmission 116 is also mechanically coupled to a drive shaft 120 that is mechanically coupled to one or more of the wheels 122. While representative electrified vehicle 112 is illustrated with a front-wheel drive propulsion system, the claimed subject matter is generally independent of the particular type of propulsion system and may include rear-wheel drive, all-wheel drive, four-wheel drive, and e-drive systems, for example. The electric machines 114 can provide propulsion and regenerative braking capability when the engine 118 is turned on or off. The electric machines 114 may also act as generators and recover energy that would normally be lost as heat in a friction braking system.

A battery pack or traction battery 124 stores energy that can be used by the electric machines 114. The traction battery 124 may provide a high voltage (HV) direct current (DC) output. As generally understood by those of ordinary skill in the art, high voltage generally refers to voltages above 60 VDC and representative traction battery packs may connect multiple low-voltage cells to operate at a pack voltage in the hundreds of volts, such as 300-800 VDC, for example. Low voltage (LV) systems and components for passenger vehicles may operate at a nominal 12 VDC, while commercial vehicles or transportation vehicles may have LV systems that operate at 24 VDC or 48 VDC, for example.

Electrified vehicle 112 may include a contactor module 142 having one or more contactors configured to isolate the traction battery 124 from a high-voltage bus 152 when opened and connect the traction battery 124 to the high-voltage bus 152 when closed. The contactor module 142 may disconnect the HV bus 152 at key-off or when the vehicle is in an accessory (ACC) or other non-propulsion mode. Contactor module 142 may include one or more contactors to connect or isolate power conversion module or charger 132 from the high-voltage bus 152. The high-voltage bus 152 may include power and return conductors for carrying current over the high-voltage bus 152. The contactor module 142 may be located in the traction battery 124. One or more power electronics modules 126 may be electrically coupled to the high-voltage bus 152.

The power electronics module(s) 126 are electrically coupled to the electric machine(s) 114 and provide the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may include a variable voltage converter (VVC) subsystem that includes a high-power combination boost and buck converter. HV energy from the traction battery 124 is boosted to a higher voltage to drive the electric machine(s) 114 with greater efficiency. For example, a 350V HV bus input from the traction battery 124 to the power electronics 126 may be boosted by the VVC subsystem to 450V or 500V to achieve most efficient electric machine operation. In the opposite direction, higher voltage energy from the electric machine(s) returning to the battery, by regenerative braking for example, is bucked down to a desired charge voltage for the traction battery 124. For vehicles that include AC electric machine(s), power electronics module 126 also includes an inverter that cooperates with the VVC to convert the DC voltage from the VVC to a three-phase AC current to operate the electric machines 114. Similarly, in a regenerative mode, the inverter of the power electronics module 126 may convert the three-phase AC current from the electric machine(s) 114 acting as generators to a DC voltage supplied to the VVC, which converts the higher DC voltage to a voltage compatible with the traction battery 124.

The power electronic(s) modules 126 may include some components mounted outside, and some components mounted inside of a housing or case for transmission 116. In various embodiments, the VVC subsystem includes an inductor assembly 170 mounted inside of the transmission 116 and a number of switches and diodes that are mounted outside of the transmission 116 in a separate housing attached to the transmission housing, or in a separate compartment of the transmission housing with an associated cover. Mounting of the inductor assembly 170 within the transmission 116 facilitates direct liquid cooling of the assembly by transmission fluid splashed or distributed by rotation of one or more gears or other rotating components of the transmission during operation of the transmission as illustrated and described in greater detail with respect to FIGS. 2-4, for example.

In addition to providing energy for propulsion, the traction battery 124 may provide energy for other vehicle electrical systems. The electrified vehicle 112 may include a DC/DC converter module 128 that converts the high voltage DC output from the high-voltage bus 152 to a low-voltage DC level of a low-voltage bus 154 that is compatible with low-voltage loads 156. An output of the DC/DC converter module 128 may be electrically coupled to a low-voltage auxiliary battery 130 (i.e., 12V, 24V, or 48V battery) for charging the auxiliary battery 130. The low-voltage loads 156 may be electrically coupled to the auxiliary battery 130 via the low-voltage bus 154. One or more controllers, such as system controller 148 may be powered by the low-voltage bus 154.

As generally understood by those of ordinary skill in the art, low-voltage components may have different voltage levels for operation, and different applications or implementations may utilize different voltage levels for similar components. Low-voltage generally refers to voltages less than 60 VDC (or 30 VAC) with some vehicles having a nominal 12V system, while others have 24V or 48V systems for powering convenience features and controllers. High-voltage generally refers to voltages greater than 60V and may range up to 1500V DC (or 1000 VAC), for example. Typical high-voltage traction batteries for passenger vehicles are in the range of 200-450 VDC while some commercial vehicles include traction batteries operating at 400-800 VDC.

The electrified vehicle 112 may be configured to recharge the traction battery 124 from an external power source 136. The external power source 136 may be a connection to an electrical outlet. The external power source 136 may be electrically coupled to a charge station or electric vehicle supply equipment (EVSE) 138. The external power source 136 may be an electrical power distribution network or grid as provided by an electric utility company. The EVSE 138 may provide circuitry and controls to manage the transfer of energy between the power source 136 and the vehicle 112. The external power source 136 may provide DC or AC electric power to the EVSE 138. The EVSE 138 may have a charge connector 140 for coupling to a charge port 134 of the vehicle 112. The charge port 134 may be any type of port configured to transfer power from the EVSE 138 to the vehicle 112. The charge port 134 may be electrically coupled to an on-board power conversion module or charger 132. The charger 132 may condition the power supplied from the EVSE 138 to provide the proper voltage and current levels to the traction battery 124 and the high-voltage bus 152.

Wheel brakes 144 may be provided for slowing the vehicle 112 and preventing motion of the vehicle 112. The wheel brakes 144 may be hydraulically actuated, electrically actuated, or some combination thereof to actuate friction pads to contact a disc or drum of the wheel. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144.

The electrified vehicle 112 may further include a human-machine interface (HMI) or user interface (UI) 160. The user interface 160 may provide a variety of display elements for communicating information to the operator. The user interface 160 may provide a variety of input elements for receiving information from the operator. The user interface 160 may include one or more displays. The displays may be touch-screen displays that both display information and receive input. The user interface 160 may include discrete lamps/lights. For example, the lamps may include light-emitting diodes (LED). The user interface 160 may include switches, rotary knobs, sliders, and buttons for allowing the operator to change various settings. The user interface 160 may include a control module that communicates via the vehicle network.

While illustrated as a single controller, controller 148 generally represents multiple vehicle controllers that receive signals from associated sensors and control corresponding actuators. Controllers or control modules may be dedicated to a particular vehicle system, subsystem, or component and may include programmable microprocessor-based controllers and microcontrollers that perform various functions and algorithms based on stored program instructions. Various controllers may communicate over one or more channels of the vehicle network(s).

FIG. 2A is a front view, and FIG. 2B is a side view, of a representative embodiment of an inductor having a fluid deflector according to the disclosure. Inductor 170 includes a fluid deflector or baffle 210 configured to redirect fluid splashed from at least one proximate rotating gear toward windings 230, which may be wrapped around a magnetic core. Inductor 170 includes a conductor 220 extending between a first terminal 242 and a second terminal 244 and wound around a magnetic core of body 240 to form a coil portion 230. In the representative embodiment illustrated, coil portion 230 includes a first portion or section 230A wrapped around a first leg and a second portion or section 230B wrapped around a second leg. Arcuate fluid deflector, diverter, or baffle 210 redirects fluid from an inlet 216 to an outlet 218 toward coil portion 230. In various embodiments, inlet 216 may contact a side wall of the transmission housing. Arcuate baffle 210 may be a cochlear-shaped or spiral-shaped device in various embodiments. Baffle 210 may be secured by bolts to bus bar terminals 242, 244 and bus bar connector 212. As best illustrated in FIG. 2B, baffle 210 may extend beyond the windings 230. The baffle angle may be adjusted or tuned to various inductor geometries or placements for corresponding applications to maximize cooling performance.

Figure 3:
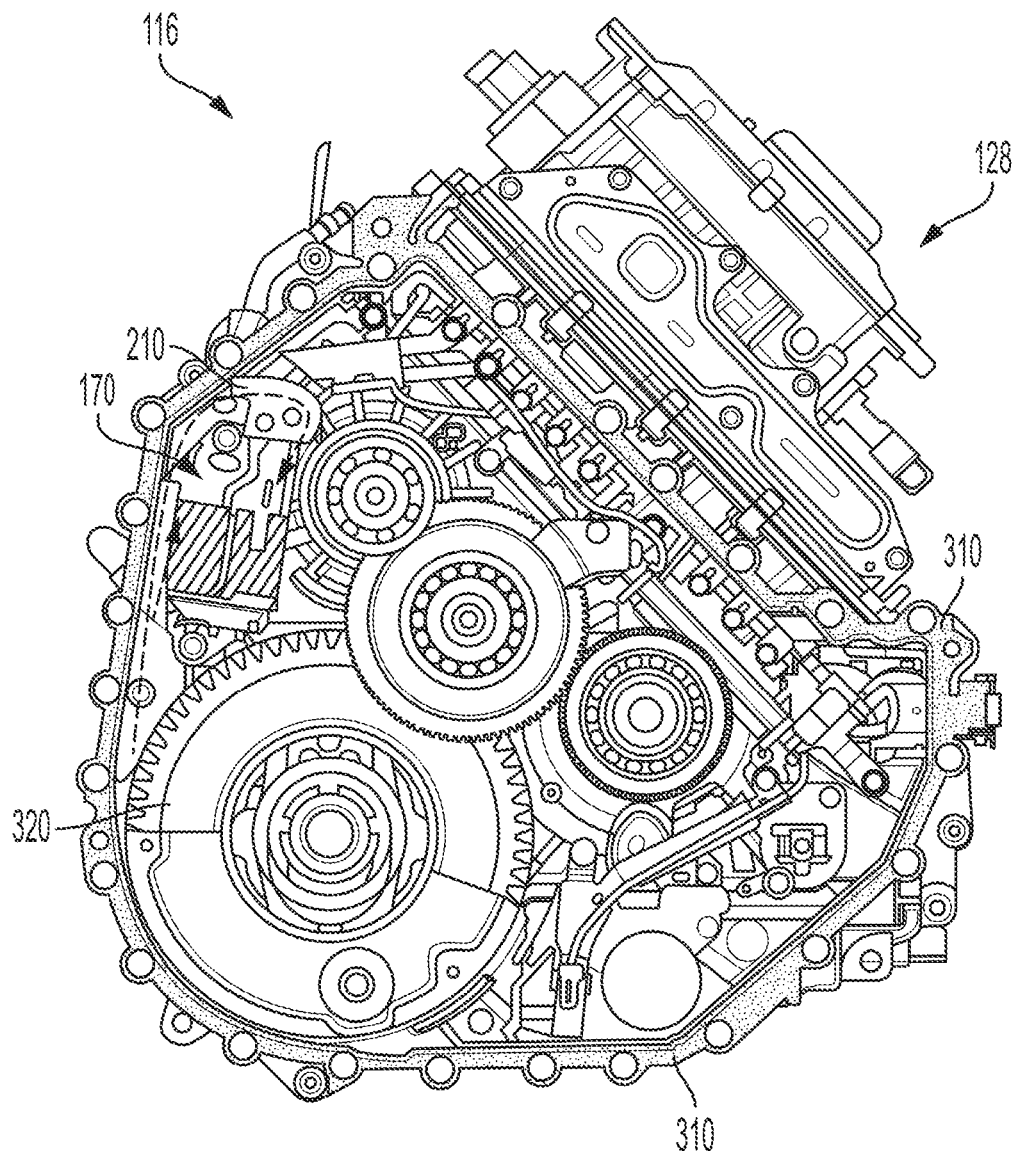
FIG. 3 illustrates a representative embodiment of an electrified vehicle transmission having an inductor with a fluid diverter configured to redirect fluid splashed during rotation of at least one gear of the transmission.

FIG. 3 illustrates a representative embodiment of an electrified vehicle transmission 116 having an inductor 170 with a fluid diverter or baffle 210 configured to redirect fluid splashed during rotation of at least one gear 320 of the transmission 116. Inductor 170 of the VVC subsystem of power electronics module 126 is disposed within a housing 310 of transmission 116 containing transmission fluid or oil. During operation of transmission 116, rotation of at least one gear 320 causes fluid to be directed generally upward along the wall of housing 310 through a narrow space between the inductor 170 and the housing 310. The fluid is redirected by arcuate baffle 210 generally downward toward the conductive coil windings of the inductor 170. Various other rotating transmission components may also splash fluid contained within transmission housing 310 onto the inductor 170 during transmission operation in addition to the fluid redirected by baffle 210.

Figure 4:
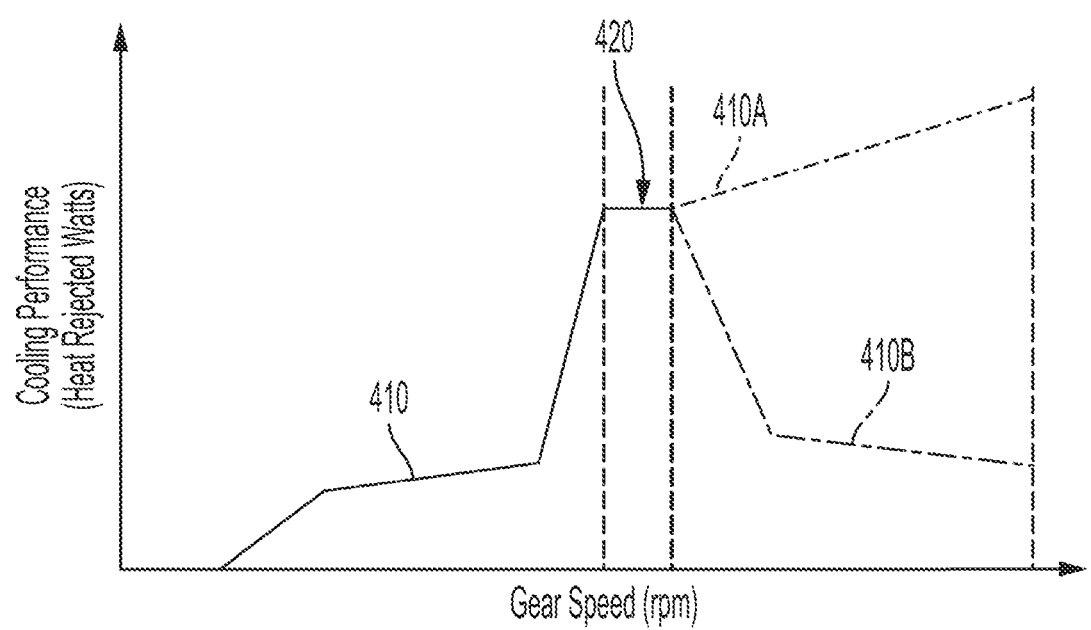
FIG. 4 is a graph illustrating cooling performance of a representative embodiment of an inductor having a fluid deflector redirecting fluid splashed by at least one rotating gear during operation of the transmission.

FIG. 4 is a graph illustrating cooling performance of a representative embodiment of an inductor having a fluid deflector or baffle redirecting fluid splashed by at least one rotating gear during operation of the transmission. Line 410 represents cooling performance (heat rejected watts) of the inductor as a function of rotational speed (rpm) of a proximate gear (or corresponding vehicle speed). As illustrated in FIG. 4, cooling performance generally increases as gear speed increases, but levels off in section 420. Line 410B represents cooling performance of an inductor without a baffle to redirect fluid and demonstrates a reduction of cooling performance within increasing gear rotational speed as fluid is splashed away from or beyond the inductor at higher rotational speeds. Line 410A represents cooling performance of an inductor with a baffle according to the present disclosure and demonstrates significantly better cooling performance that continues to increase with increasing rotational speed of at least one proximate gear.

The representative embodiments described are not intended to encompass all possible forms within the scope of the claims. The words used in the specification are words of description rather than limitation, and it is understood that various changes can be made consistent with the teachings of the disclosure within the scope of the claimed subject matter. As previously described, one or more features of various embodiments can be combined to form further embodiments that may not be explicitly described or illustrated. Although embodiments that have been described as providing advantages over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to strength, durability, life cycle, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. An electrified vehicle having an electric machine powered by a battery to propel the electrified vehicle, comprising:
   a transmission including at least one gear disposed within a housing and configured to rotate within the housing and splash fluid within the housing;
   an inductor including a core having conductive windings wrapped around the conductive core, the inductor disposed within the housing proximate to the at least one gear; and
   a baffle connected to the inductor and configured to redirect fluid splashed from the at least one gear toward the core and conductive windings.

2. The electrified vehicle of claim 1 wherein the baffle comprises an arcuate baffle configured to redirect fluid splashed between the housing and the inductor toward the core and conductive windings.

3. The electrified vehicle of claim 2 wherein the baffle is secured to terminals connecting the conductive windings of the inductor to a bus bar of the electrified vehicle.

4. The electrified vehicle of claim 3 wherein the inductor is electrically connected to a voltage converter connected to the battery and the electric machine.

5. The electrified vehicle of claim 1 wherein the inductor is positioned at least partially above the at least one gear and the baffle is positioned above the core and the conductive windings.

6. The electrified vehicle of claim 1 wherein the baffle comprises an arcuate baffle including an inlet in contact with the housing.

7. The electrified vehicle of claim 6 wherein the baffle comprises a cochlear baffle.

8. The electrified vehicle of claim 1 wherein the inductor comprises a body having first and second legs with a first section of the conductive windings wrapped around the first leg and a second section of the conductive windings wrapped around the second leg, and wherein the baffle extends over the first and second legs.

9. The electrified vehicle of claim 8 wherein the baffle comprises an arcuate baffle having an inlet in contact with the housing.

10. An electrified vehicle having an electric machine powered by a battery to propel the electrified vehicle, comprising:
    a transmission housing;
    at least one gear disposed within the transmission housing and configured to splash fluid within the transmission housing while the at least one gear is rotating; and
    an inductor disposed within the transmission housing and including a coil wound around a core, the coil positioned with at least a portion of an exterior surface exposed to the fluid splashed during rotation of the at least one gear, the inductor including an arcuate fluid diverter positioned to redirect a portion of the fluid splashed during rotation of the at least one gear toward the coil.

11. The electrified vehicle of claim 10 wherein the arcuate fluid diverter includes an inlet redirecting fluid splashed between the inductor and the transmission housing.

12. The electrified vehicle of claim 11 wherein the inlet of the arcuate fluid diverter contacts the transmission housing.

13. The electrified vehicle of claim 10 wherein the coil comprises a first portion wound around a first leg and a second portion would around a second leg.

14. The electrified vehicle of claim 10 wherein the inductor is electrically connected to a variable voltage converter (VVC).

15. The electrified vehicle of claim 14 wherein the arcuate fluid diverter is secured to bus bar terminals electrically connecting the inductor to the VVC.

* * * * *